United States Patent
Moon et al.

(10) Patent No.: US 9,202,828 B2
(45) Date of Patent: Dec. 1, 2015

(54) ORGANIC LIGHT-EMITTING DISPLAY APPARATUS

(71) Applicant: SAMSUNG DISPLAY CO., LTD., Yongin, Gyeonggi-do (KR)

(72) Inventors: Sang-Ho Moon, Yongin (KR); Jong-Moo Huh, Yongin (KR); Sung-Ho Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/631,023

(22) Filed: Feb. 25, 2015

(65) Prior Publication Data

US 2015/0171121 A1  Jun. 18, 2015

Related U.S. Application Data

(62) Division of application No. 13/869,284, filed on Apr. 24, 2013, now Pat. No. 9,012,916.

(30) Foreign Application Priority Data

Dec. 6, 2012 (KR) .................. 10-2012-0141197

(51) Int. Cl.
*H01L 29/00* (2006.01)
*H01L 21/00* (2006.01)
(Continued)

(52) U.S. Cl.
CPC ...... *H01L 27/1274* (2013.01); *H01L 21/02422* (2013.01); *H01L 21/02488* (2013.01);
(Continued)

(58) Field of Classification Search
CPC .................. H01L 21/31144; H01L 21/02422; H01L 21/02488; H01L 21/02532; H01L 21/02595; H01L 21/02667; H01L 21/02686; H01L 21/31111; H01L 21/266; H01L 21/02678; H01L 21/02592; H01L 27/3244; H01L 27/1285; H01L 27/1288; H01L 27/1274; H01L 27/1255; H01L 27/32652; H01L 28/60; H01L 29/66757; H01L 2227/323
See application file for complete search history.

(56) References Cited

U.S. PATENT DOCUMENTS 7,312,099 B2   12/2007  Chae et al.
2008/0067519 A1  3/2008  Sakurai et al.
(Continued)

FOREIGN PATENT DOCUMENTS

CN    102655089 A   9/2012
JP    2005-209927   8/2005
(Continued)

OTHER PUBLICATIONS

Patent Abstracts of Japan Publication No. JP 10-135135, dated May 22, 1998 for JP 3734580 B, 1 page.
(Continued)

*Primary Examiner* — Nikolay Yushin
(74) *Attorney, Agent, or Firm* — Christie Parker & Hale, LLP

(57) ABSTRACT

A method of manufacturing a polysilicon (poly-Si) layer, a method of manufacturing an organic light-emitting display apparatus using the method, and an organic light-emitting display apparatus manufactured by using the method. The method includes forming an amorphous silicon (a-Si) layer on a substrate having first and second areas, thermally treating the a-Si layer to partially crystallize the a-Si layer into a partially crystallized Si layer, removing a thermal oxide layer through a thermal treatment, selectively irradiating the first areas with laser beams to crystallize the partially crystallized Si layer.

18 Claims, 15 Drawing Sheets

(51) Int. Cl.

| | |
|---|---|
| H01L 27/12 | (2006.01) |
| H01L 21/02 | (2006.01) |
| H01L 27/32 | (2006.01) |
| H01L 21/266 | (2006.01) |
| H01L 21/311 | (2006.01) |
| H01L 49/02 | (2006.01) |
| H01L 29/66 | (2006.01) |

(52) U.S. Cl.
CPC .... *H01L21/02532* (2013.01); *H01L 21/02592* (2013.01); *H01L 21/02595* (2013.01); *H01L 21/02667* (2013.01); *H01L 21/02678* (2013.01); *H01L 21/02686* (2013.01); *H01L 21/266* (2013.01); *H01L 21/31111* (2013.01); *H01L 21/31144* (2013.01); *H01L 27/1255* (2013.01); *H01L 27/1285* (2013.01); *H01L 27/1288* (2013.01); *H01L 27/3244* (2013.01); *H01L 27/3265* (2013.01); *H01L 28/60* (2013.01); *H01L 29/66757* (2013.01); *H01L 2227/323* (2013.01)

(56) References Cited

U.S. PATENT DOCUMENTS

| | | |
|---|---|---|
| 2011/0169010 A1 | 7/2011 | Park et al. |
| 2011/0278615 A1 | 11/2011 | No et al. |
| 2012/0043546 A1 | 2/2012 | Oh et al. |
| 2014/0057419 A1 | 2/2014 | Tian et al. |

FOREIGN PATENT DOCUMENTS

| | | |
|---|---|---|
| JP | 3734580 B | 10/2005 |
| KR | 10-2007-0067262 | 6/2007 |
| KR | 10-1030031 | 4/2011 |
| KR | 10-2012-0016783 | 2/2012 |
| WO | WO 2005/086211 A1 | 9/2005 |
| WO | WO 2008/072454 A1 | 6/2008 |

OTHER PUBLICATIONS

EPO Search Report dated Jun. 25, 2014, for corresponding European Patent application 13171624.3, (16 pages).

ORGANIC LIGHT-EMITTING DISPLAY APPARATUS

CROSS-REFERENCE TO RELATED APPLICATION

This application is a divisional of U.S. patent application Ser. No. 13/869,284, filed on Apr. 24, 2013, entitled "ORGANIC LIGHT-EMITTING DISPLAY APPARATUS," which claims priority to and the benefit of Korean Patent Application No. 10-2012-0141197, filed on Dec. 6, 2012, in the Korean Intellectual Property Office, the entire disclosures of both of which are incorporated herein by reference.

BACKGROUND

1. Field

The following description relates to a method of manufacturing a polycrystalline silicon layer, a method of manufacturing an organic light-emitting display apparatus including the same, and an organic light-emitting display apparatus manufactured by using the same.

2. Description of the Related Art

An active matrix (AM) type organic light-emitting display apparatus includes a pixel driving circuit in each pixel, and the pixel driving circuit includes a thin film transistor (TFT) using silicon. The TFT may be formed of amorphous silicon or polycrystalline silicon.

Since a semiconductor active layer having a source, a drain, and a channel is formed of amorphous silicon (a-Si), an a-Si TFT used in the pixel driving circuit has a low electron mobility of 1 cm$^2$/Vs or less. Therefore, the a-Si TFT has been recently replaced with a polycrystalline silicon (poly-Si) TFT. The poly-Si TFT has a higher electron mobility and a safer light illumination than the a-Si TFT. Therefore, the poly-Si TFT is appropriate to drive an AM type organic light-emitting display apparatus and/or to be used as an active layer of a switching TFT.

The poly-Si may be manufactured according to several methods. These methods can be generally classified as either a method of depositing poly-Si or a method of depositing and crystallizing a-Si.

Examples of the method of depositing the poly-Si include chemical vapor deposition (CVD), photo CVD, hydrogen radial (HR) CVD, electron cyclotron resonance (ECR) CVD, plasma enhanced (PE) CVD, low pressure (LP) CVD, etc.

Examples of the method of depositing and crystallizing the a-Si include solid phase crystallization (SPC), an excimer laser crystallization (ELC), metal induced crystallization (MIC), sequential lateral solidification (SLS), etc.

SUMMARY

Aspects of embodiments of the present invention are directed toward a method of manufacturing a polycrystalline silicon layer capable of improving crystallization productivity and a capacitance characteristic of a capacitor, a method of manufacturing an organic light-emitting display apparatus including the same, and an organic light-emitting display apparatus manufactured by using the same.

According to an embodiment of the present invention, a method of manufacturing a polysilicon (poly-Si) layer is provided. The method includes forming an amorphous silicon (a-Si) layer on a substrate, the substrate having a first area and a second area; thermally treating the a-Si layer to convert the a-Si layer into a partially crystallized Si layer; removing a thermal oxide layer formed by the thermally treating of the a-Si layer; and selectively irradiating the first area with laser beams to crystallize the partially crystallized Si layer.

The method may further include forming a buffer layer on the substrate before the forming of the a-Si layer.

The substrate may have a plurality of first areas including the first area and a plurality of second areas including the second area. The plurality of first areas and the plurality of second areas may alternate with each other and are spaced apart.

A crystallinity of the partially crystallized Si layer may be in a range between 65% and 80%.

The thermally treating of the a-Si layer may include thermally treating the a-Si at a temperature between 650° C. and 780° C.; partially crystallizing the a-Si layer into the partially crystallized Si layer; and forming the thermal oxide layer on the partially crystallized Si layer.

The selectively irradiating of the first area with the laser beams may include selectively irradiating the partially crystallized Si layer with the laser beams on the first area; and crystallizing the partially crystallized Si layer to convert the partially crystallized Si layer into a poly-Si layer.

The poly-Si layer may have a higher crystallinity than the partially crystallized Si layer.

The crystalline structure of the poly-Si layer may be different from a crystalline structure of the partially crystallized Si layer.

The grains sizes of the poly-Si layer may be randomly formed.

The poly-Si layer may grow in two directions based on a longitudinal central axis of grains of the partially crystallized Si layer.

The grains sizes of the partially crystallized Si layer may be uniformly formed.

The removing of the thermal oxide layer may include using a buffered oxide etchant (BOE) or hydrogen fluoride (HF).

The laser beams may be excimer laser beams.

According to another embodiment of the present invention, an organic light-emitting display apparatus is provided. The organic light-emitting display apparatus includes a substrate, the substrate having a first area and a second area; and a plurality of light-emitting devices on the substrate. Each of the light-emitting devices comprises a thin film transistor (TFT), a light-emitting unit, and a capacitor, aligned in a longitudinal direction, and the light-emitting devices of the plurality of light-emitting devices that are adjacent to each other in the longitudinal direction are arranged such that the TFTs are adjacent to each other and/or the capacitors are adjacent to each other.

The TFTs of the adjacent light-emitting devices of the plurality of light-emitting devices may be positioned in the first area.

The capacitors of the adjacent light-emitting devices of the plurality of light-emitting devices may be positioned in the second area.

The TFT may include an active layer on the substrate; a gate electrode insulated from the active layer and arranged on the substrate; and source and drain electrodes insulated from the gate electrode and electrically connected to the active layer, wherein the active layer is on the first area.

The capacitor may include a capacitor lower electrode on a same layer as the active layer; and a capacitor upper electrode insulated from the capacitor lower electrode; wherein the capacitor lower electrode is on the second area.

The active layer may be a poly-Si layer, and the capacitor lower electrode may be a partially crystallized Si layer.

The poly-Si layer may have a higher crystallinity than the partially crystallized Si layer.

The crystallinity of the partially crystallized Si layer may be between 65% and 80%.

The capacitor lower electrode may be the partially crystallized Si layer.

The active layer may be the poly-Si layer.

The light-emitting units may be arranged on a third area between the first area and the second area.

Each of the light-emitting units may include a pixel electrode on the substrate and electrically connected to the TFT; intermediate layers on the pixel electrode and having an organic emission layer; and a counter electrode opposite to the pixel electrode such that the intermediate layers are between the counter electrode and the pixel electrode.

According to another aspect of the present invention, there is provided a method of manufacturing an organic light-emitting display apparatus. The method includes a first mask process comprising forming an a-Si layer on a substrate having a first area and a second area, partially crystallizing the a-Si layer to convert the a-Si layer into a partially crystallized Si layer, re-crystallizing the partially crystallized Si layer on the first area to form a poly-Si layer, patterning the poly-Si layer on the first area to form active layers of TFTs, and patterning the partially crystallized Si layer on the second area to form lower electrodes of capacitors; a second mask process comprising forming a first insulating layer and a transreflective metal on the substrate to cover the active layers and the lower electrodes of the capacitors and patterning the transreflective metal to form pixel electrodes; a third mask process comprising sequentially forming a transparent conductive layer and a first metal layer on the substrate to cover the pixel electrodes and patterning the transparent conductive layer and the first metal layer to form first and second gate electrodes of the TFTs and first and second upper electrodes of the capacitors; a fourth mask process comprising forming a second insulating layer to cover the pixel electrodes, the first and second gate electrodes, and the first and second upper electrodes and patterning the second insulating layer to form openings exposing the pixel electrodes, source and drain areas of the active layers, and the second upper electrodes; a fifth mask process comprising forming a second metal layer to cover the pixel electrodes and the openings and patterning the second metal layer to form source and drain electrodes; and a sixth mask process comprising forming a third insulating layer to cover the source and drain electrodes and patterning the third insulating layer to expose the pixel electrodes.

The first mask process may further include forming a buffer layer on the substrate before the forming of the a-Si layer.

The substrate may have a plurality of the first areas comprising the first area, and a plurality of the second areas comprising the second area, and the plurality of the first areas and the plurality of the second areas alternate with each other and are spaced apart.

The partially crystallized Si layer may have a crystallinity of between about 65% and about 80%.

The partially crystallizing the a Si-layer in the first mask process may include thermally treating the a-Si layer formed on the substrate at a temperature between 650° C. and 780° C.; partially crystallizing the a-Si layer into the partially crystallized Si layer; and forming a thermal oxide layer on the partially crystallized Si layer.

The re-crystallizing the partially crystallized Si layer on the first areas in the first mask process may include selectively irradiating the partially crystallized Si layer on the first area with laser beams; and re-crystallizing the partially crystallized Si layer into a poly-Si layer.

The poly-Si layer may have a higher crystallinity than the partially crystallized Si layer.

The thermal oxide layer may be removed by using a BOE or HF.

The laser beams may be excimer laser beams.

The method may further include using the second gate electrodes as masks to dope the source and drain areas of the active layers with an ion dopant after the third mask process.

The method may further include exposing the first upper electrodes, and doping the lower electrodes with an ion dopant through the exposed first upper electrodes.

The transreflective metal may include a silver (Ag) alloy.

The silver (Ag) alloy may include palladium (Pd) or copper (Cu).

The transreflective metal may have a thickness of between 80 Å and 200 Å.

In the third mask process, the sequentially forming of the transparent conductive layer and the first metal layer on the substrate to cover the pixel electrodes, may include patterning the transparent conductive layer and the first metal layer to sequentially cover the pixel electrodes.

The fourth mask process may further include patterning the second insulating layer to form an opening exposing the first metal layer covering the pixel electrodes.

The fifth mask process may further include removing the first metal layer and the second metal layer covering the pixel electrodes.

The first and second metal layers may be a same kind of material.

BRIEF DESCRIPTION OF THE DRAWINGS

The above and other features of the present invention will become more apparent in the following description of embodiments together with the attached drawings in which.

DETAILED DESCRIPTION

The present invention will now be described in more detail with reference to the accompanying drawings, in which embodiments of the invention are shown. The invention may, however, be embodied in many different forms and should not be construed as being limited to the embodiments set forth herein. Rather, these embodiments are provided by way of example, in order to convey concepts and features of the invention to those of ordinary skill in the art.

FIGS. 1 through 4 are schematic cross-sectional views illustrating a process of manufacturing a polycrystalline silicon layer according to an embodiment.

Figure 1:
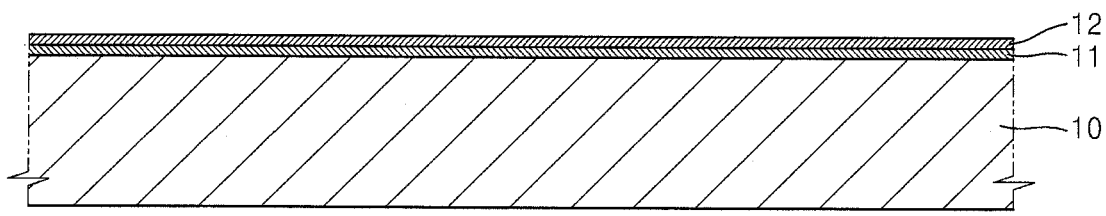
FIGS. 1 through 4 are schematic cross-sectional views illustrating a process of manufacturing a polycrystalline silicon layer according to an embodiment.

As shown in FIG. 1, a buffer layer 11 and an amorphous silicon (a-Si) layer 12 are formed on a substrate 10.

The substrate 10 may be formed of a transparent glass material including $SiO_2$ as a main component (or major component). The buffer layer 11 including $SiO_2$ and/or $SiN_x$ to improve smoothness and prevent penetration of impurity elements is further formed on the substrate 10.

The buffer layer 11 and the a-Si layer 12 may be deposited by using various suitable methods including but not limited to plasma enhanced chemical vapor deposition (PECVD), atmospheric pressure CVD (APCVD), and/or low pressure CVD (LPCVD).

The a-Si layer 12 is formed on the buffer layer 11. The a-Si silicon layer 12 is crystallized by a process, which is described in more detail later, to provide a polycrystalline silicon (poly-Si) layer.

Figure 2:
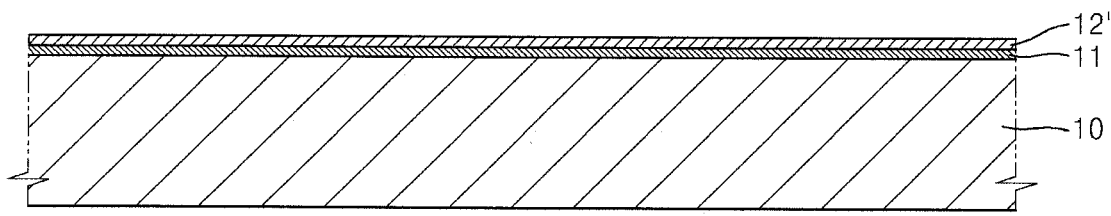

As shown in FIG. 2, the a-Si layer 12 is partially crystallized to form a partially crystallized Si layer 12'.

The partial crystallization provides a crystallinity of the partially crystallized Si layer 12' in a range between about 65% and about 80%.

The a-Si layer 12 is thermally treated at a temperature between 650° C. and 780° C. to form the partially crystallized Si layer 12'. If the a-Si layer 12 is thermally treated at the temperature between 650° C. and 780° C., a dehydrating process occurs in the a-Si layer 12, and thus the a-Si layer 12 is converted into the partially crystallized Si layer 12' with a crystallinity in a range between about 65% and about 80%.

Figure 3:
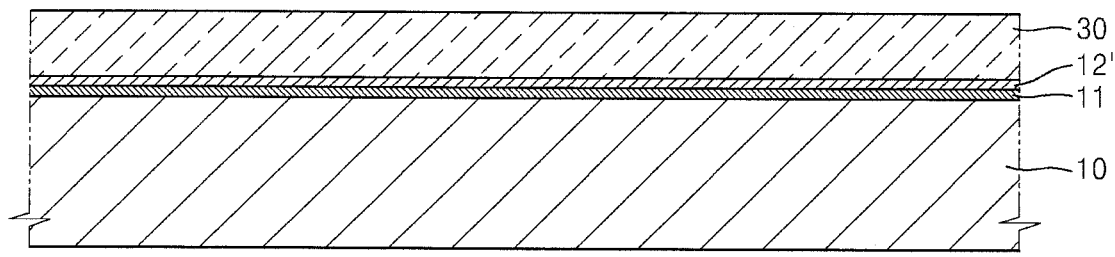

Following thermally treating the a-Si layer 12, a thermal oxide layer 30 is removed. In more detail, if the a-Si layer 12 is thermally treated at a temperature between 650° C. and 780° C., the a-Si layer 12 is crystallized into the partially crystallized Si layer 12', and a thermal oxide layer 30 is formed on the partially crystallized Si layer 12', as shown in FIG. 3.

The thermal oxide layer 30 has a denser structure than a natural oxide layer. In an embodiment, if laser crystallization, which will be described in more detail later, is performed by using laser beams when the thermal oxide layer 30 is still present, energy absorbed in the partially crystallized Si layer 12' and the substrate 10 will not properly be discharged due to the thermal oxide layer 30. In this case, stains occur in a poly-Si layer, and over-crystallization of p-Si occurs.

Therefore, in an embodiment, the thermal oxide layer 30 is removed before the laser crystallization is performed. In an embodiment, the thermal oxide layer 30 is removed by using a buffered oxide etchant (BOE) or hydrogen fluoride (HF).

Figure 4:
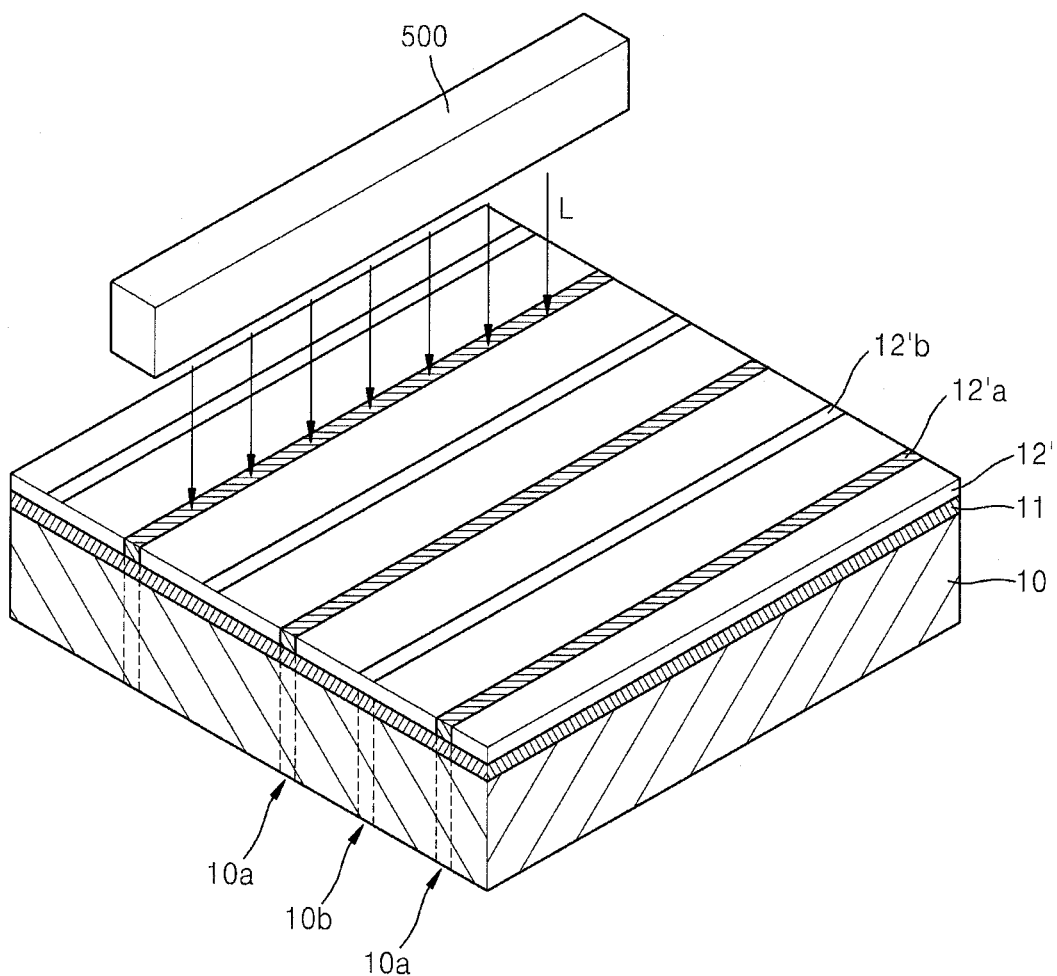

As shown in FIG. 4, a laser beam is used to selectively irradiate and selectively crystallize the partially crystallized Si layer 12'.

In more detail, the substrate 10 has first and second areas 10a and 10b. The first and second areas 10a and 10b alternate on the substrate 10 and are spaced apart. As described above, the a-Si layer 12 is formed on an entire surface of the substrate 10 and is partially crystallized into the partially crystallized Si layer 12' through a partial crystallization process. The partially crystallized Si layer 12' is formed on the first and second areas 10a and 10b. However, laser beams L irradiate only the partially crystallized Si layer 12' formed on the first areas 10a to crystallize the partially crystallized Si layer 12' formed on the first areas 10a and form a poly-Si layer 12'a. In other words, the poly-Si layer 12'a is formed on the first areas 10a, and a partially crystallized Si layer 12'b is formed on the second areas 10b.

A crystallinity of the partially crystallized Si layer 12'b is in a range between about 65% and about 80% as described above. However, a crystallinity of the poly-Si layer 12'a is higher than the crystallinity of the partially crystallized Si layer 12'b and may be in a range between about 80% and about 100%.

A laser irradiator 500 moves relative to the substrate 10 to irradiate the partially crystallized Si layer 12' formed on the first areas 10a with laser beams. In other words, the laser irradiator 500 moves above the substrate 10 or moves above a stage on which the substrate 10 is placed, to irradiate the first areas 10a with laser beams. The laser irradiator 500 may radiate excimer laser beams.

According to an embodiment of the present invention, laser beams may not irradiate an entire surface of the a-Si layer 12 to crystallize the a-Si layer 12 formed on the substrate 10. Instead, laser beams may selectively irradiate only the first areas 10a of the substrate 10. Therefore, the number of times the laser beams are used to irradiate may be reduced. As a result, a production capacity of laser equipment may be improved, and productivity may be improved.

Figure 5:
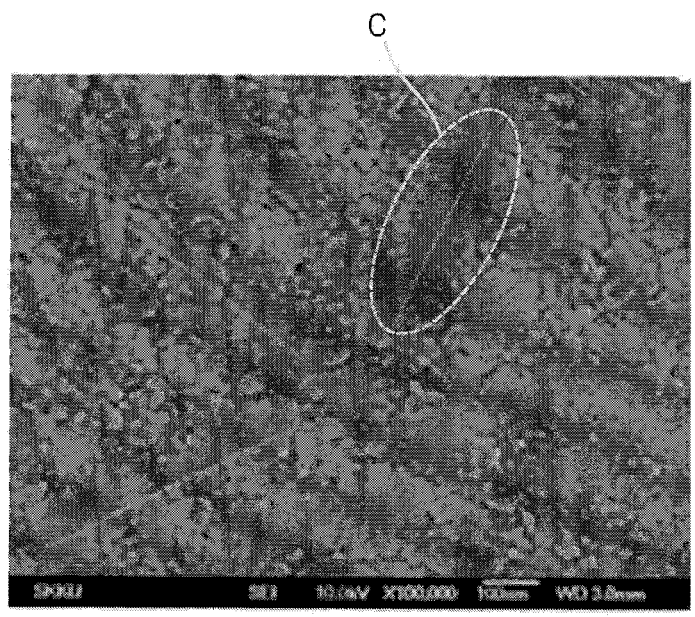
FIG. 5 is a view illustrating a scanning electron microscope (SEM) image of a partially crystallized polycrystalline silicon layer according to an embodiment.

FIG. 5 is a view illustrating a scanning electron microscope (SEM) image of a partially crystallized Si layer according to an embodiment.

As shown in FIG. 5, if a thermal treatment is performed at a temperature between 650° C. and 780° C., an a-Si layer is partially crystallized to form a partially crystallized Si layer. The partial crystallization provides a crystallinity between about 65% and 80%. In other words, crystal structures C having long bar shapes are partially formed in FIG. 5. The crystal structures C having the long bar shapes operate as seeds in a growth direction and are in the form of grains when performing laser crystallization.

Figure 8:
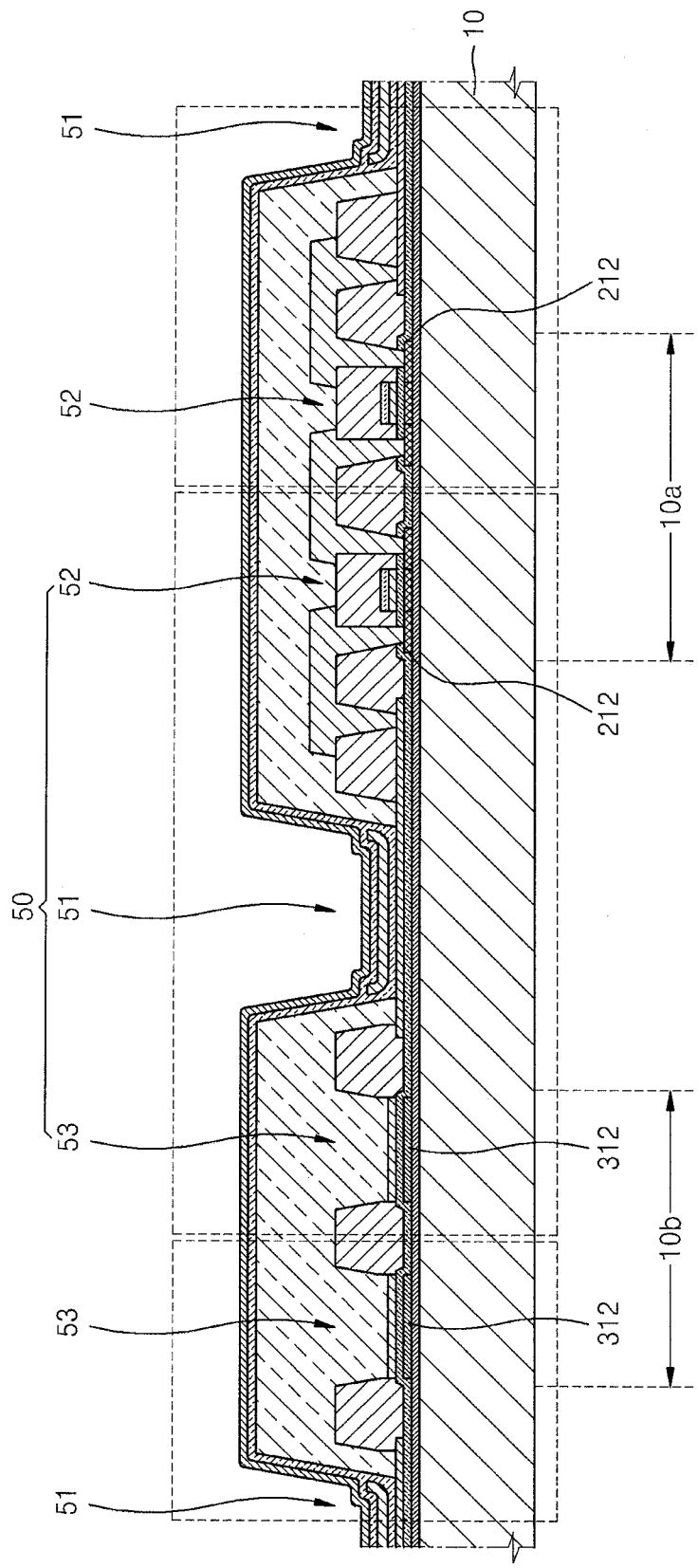
FIG. 8 is a schematic cross-sectional view illustrating the organic light-emitting display apparatus of FIG. 7.

The partially crystallized Si layer forms a capacitor lower electrode 312 of a capacitor 53, as shown in FIG. 8. Although the partially crystallized Si layer has a low crystallinity, the partially crystallized Si layer has a high crystallization uniformity, thereby stabilizing the capacitance characteristic of the capacitor.

Figure 6:
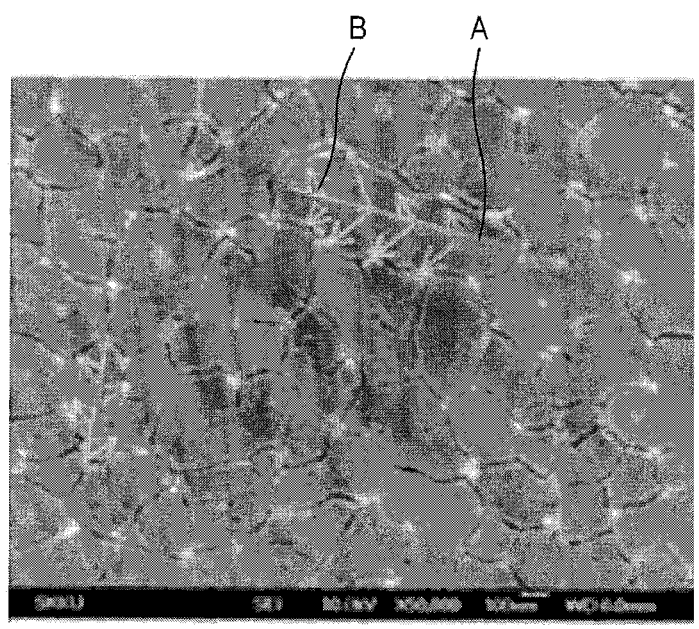
FIG. 6 is a view illustrating an SEM image of a re-crystallized polycrystalline silicon layer according to an embodiment.

FIG. 6 is a view illustrating a SEM image of a re-crystallized poly-Si layer according to an embodiment.

An a-Si layer is thermally treated at a temperature between 650° C. and 780° C. to form a partially crystallized Si layer. A thermal oxide layer formed on the partially crystallized Si layer in the thermal treatment process is removed. Laser beams are then used to irradiate an area of the partially crystallized Si layer to re-crystallize the partially crystallized Si layer in order to form a poly-Si layer. FIG. 6 illustrates a SEM image of the poly-Si layer according to an embodiment which is re-crystallized by irradiation with laser beams. If laser beams are used for irradiation after the thermal treatment at the temperature between 650° C. and 780° C. and after the removal of the thermal oxide layer, twin growths progress in different directions based on a central axis A in a grain boundary, and thus crystallization progresses. The sizes of grains vary randomly with the progress of crystallization.

As described above, the poly-Si layer is thermally treated at a temperature between 650° C. and 780° C. to form the partially crystallized Si layer having a crystallinity between 65% and 80%, and then is re-crystallized using an excimer laser. Grain shapes are insensitive (or substantially insensitive) to changes in laser energy. An optimum energy density (OPED) margin is greater than that of a general excimer laser annealing (ELA) crystallization, which can thus improve mass-production. Also, a characteristic of a thin film transistor (TFT) is improved, and crystal stains do not (or substantially do not) occur according to changes of laser energy. Therefore, luminance uniformity is high when driving low and middle gradations of an organic light-emitting display apparatus, and thus a higher quality organic light-emitting display apparatus may be manufactured.

Figure 7:
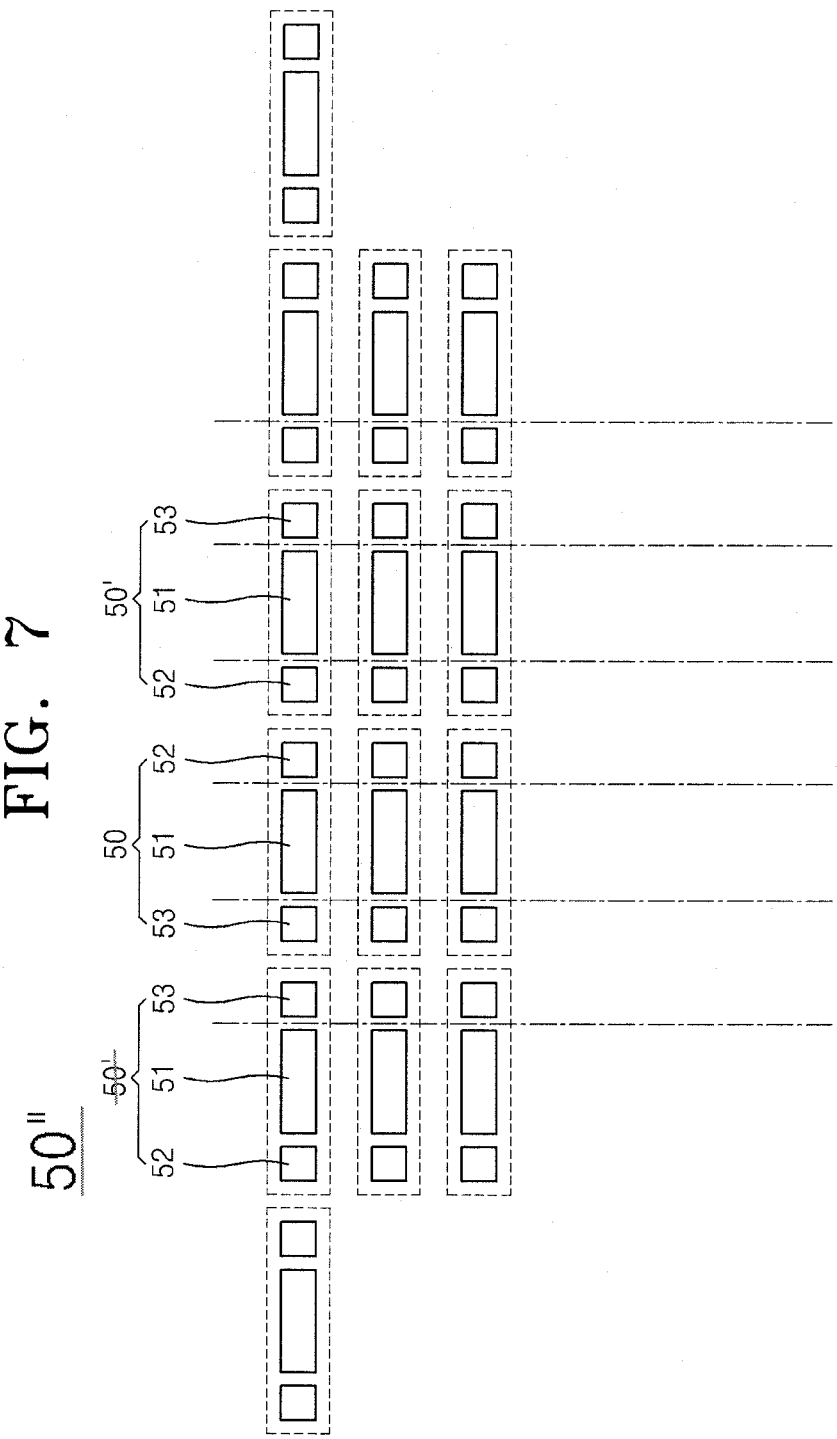
FIG. 7 is a schematic plan view illustrating an organic light-emitting display apparatus according to an embodiment of the present invention.

FIG. 7 is a schematic plan view illustrating an organic light-emitting display apparatus according to an embodiment of the present invention. FIG. 8 is a schematic cross-sectional view illustrating the organic light-emitting display apparatus of FIG. 7.

Referring to FIGS. 7 and 8, the organic light-emitting display apparatus according to an embodiment includes a plurality of light-emitting devices 50, 50', and 50" formed on a substrate 10. Each of the light-emitting devices 50, 50', and 50" includes a TFT 52, a light-emitting unit 51, and a capacitor 53. The TFT 52, the light-emitting unit 51, and the capacitor 53 may be sequentially formed in that order, in a longitudinal direction of each of the light-emitting devices 50, or may be formed order of the capacitor 53, the light-emitting unit 51, and the TFT 52, in a longitudinal direction of each of the light-emitting devices 50.

The TFTs 52 are formed on first areas 10a of the substrate 10, and the capacitors 53 are formed on second areas 10b of the substrate 10.

As shown in FIG. 7, the TFTs 52 or the capacitors 53 of the plurality of light-emitting devices 50, 50', and 50" are adjacent to each other in a longitudinal direction. The TFT 52 of the light-emitting device 50 is adjacent to the TFT 52 of adjacent light-emitting device 50'. Also, the capacitor 53 of the light-emitting device 50 is adjacent to the capacitor 53 of adjacent light-emitting device 50".

Therefore, according to an embodiment, regardless of the types of the light-emitting devices 50, 50', and 50", the TFTs 52 are disposed on the first areas 10a of the substrate 10, and the capacitors 53 are disposed on the second areas 10b of the substrate 10. In other words, active layers 212 of the TFTs 52 are disposed on the first area 10a of the substrate 10 and formed of the poly-Si layer 12' of FIG. 4. Capacitor lower electrodes 312 of the capacitors 53 are disposed on the second areas 10b of the substrate 10 and formed of the partially crystallized Si layer 12'b of FIG. 4. The partially crystallized Si layer 12'b formed on the plurality of second areas 10b of the substrate 10 has a uniform crystallization to provide stable capacitors.

FIGS. 9 through 27 are schematic cross-sectional views illustrating a process of manufacturing an organic light-emitting display apparatus according to an embodiment of the present invention.

FIGS. 9 through 26 are schematic cross-sectional views illustrating a process of manufacturing the organic light-emitting display apparatus according to some embodiments. FIG. 19 is a schematic cross-sectional view illustrating the organic light-emitting display apparatus manufactured by the manufacturing method according to an embodiment.

Figure 9:
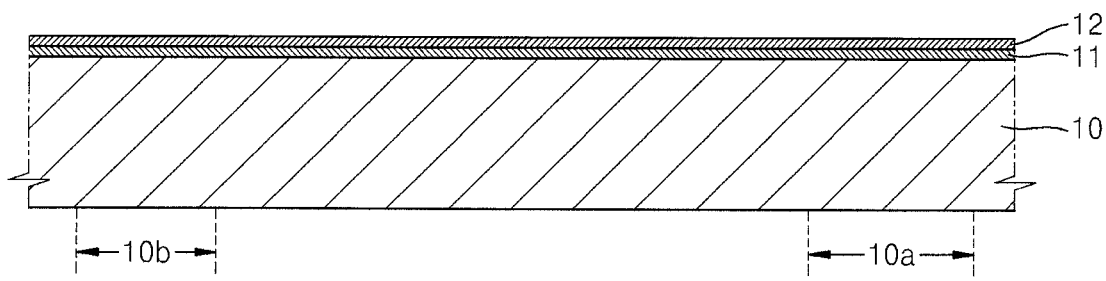
FIGS. 9 through 27 are schematic cross-sectional views illustrating a process of manufacturing an organic light-emitting display apparatus according to an embodiment of the present invention.

Referring to FIG. 9, a buffer layer 11 and an a-Si layer 12 are formed on a substrate 10.

The substrate 10 may be formed of a transparent glass material including $SiO_2$ as a main component. The buffer layer 11 (including $SiO_2$ and/or $SiN_x$ to improve the smoothness of the substrate 10 and prevent a penetration of impurity elements) is formed on the substrate 10.

The buffer layer 11 and the a-Si layer 12 may be deposited according to various suitable deposition methods such as PECVD, APCVD, and/or LPCVD.

The a-Si layer 12 is deposited on the buffer layer 11. The a-Si layer 12 is thermally treated at a temperature between 650° C. and 780° C. to be partially crystallized in order to form a partially crystallized Si layer 12'. Laser beams irradiate first areas 10a to selectively re-crystallize the partially crystallized Si layer 12' on the first areas 10a in order to form a poly-Si layer 12'a.

Figure 10:
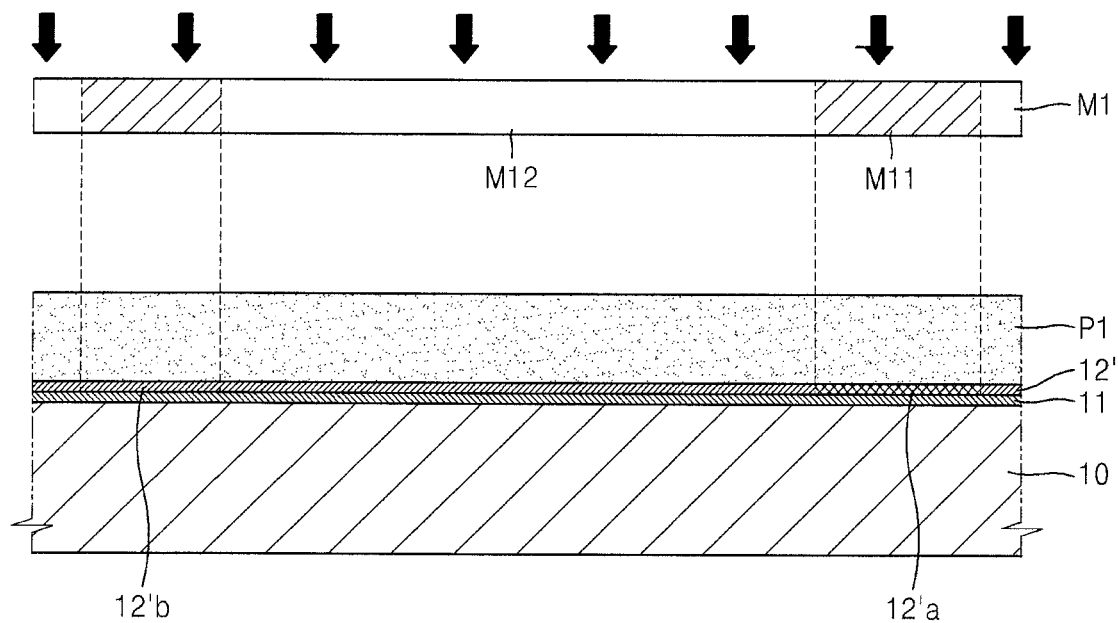

Referring to FIG. 10, a first photoresist P1 is coated on the partially crystallized Si layer 12', and a first mask process is performed by using a first photomask M1 including light shielding parts M11 and light transmitting parts M12.

In an embodiment, a series of processes such as exposing, developing, etching, and stripping or ashing are performed with respect to the first photomask M1 using an exposure apparatus.

Figure 11:
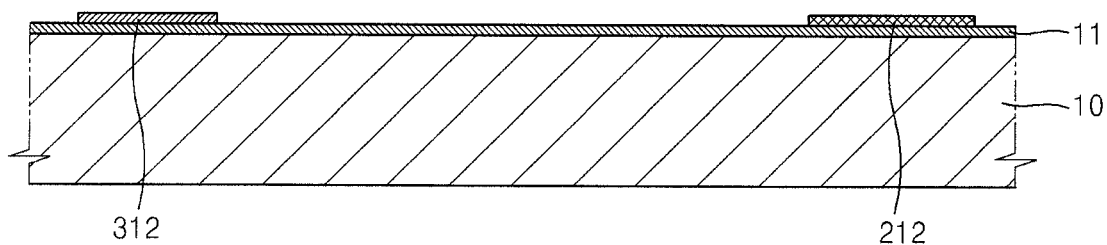

Referring to FIG. 11, as a result of the first photomask process, the partially crystallized Si layer 12' is patterned into a portion which will be an active layer 212 of a TFT and into a portion which will be a lower electrode 312 of a capacitor.

Figure 12:
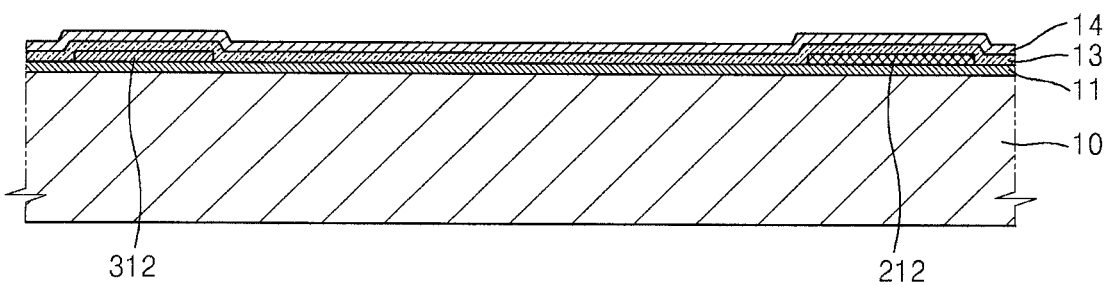

Referring to FIG. 12, a first insulating layer 13 and a transflective metal layer 14 are sequentially stacked on a structure resulting from the patterning of the partially crystallized Si layer 12' in FIG. 11.

The first insulating layer 13 may include a single layer or a multiple layer formed of $SiO_2$, $SiN_x$, or the like and operates as a gate insulating layer of a TFT and a dielectric layer of a capacitor which will be described later.

The transflective metal layer 14 may be formed of a silver (Ag) alloy. The transflective metal layer 14 may further include palladium (Pd) and copper (Cu) and operates as a transreflective mirror and as a pixel electrode of an organic light-emitting display apparatus having an optical resonance structure.

The transreflective metal layer 14 is formed to have a thickness of between 50 Å and 200 Å. In one embodiment, if the thickness of the transreflective metal layer 14 is thinner than 50 Å, reflexibility is lowered. Therefore, it can be difficult to achieve an optical resonance with a counter electrode which will be described in more detail later. In one embodiment, if the thickness of the transreflective metal layer 14 is greater than 200 Å, transmissivity is lowered. Therefore, luminance efficiency may be lowered.

Figure 13:
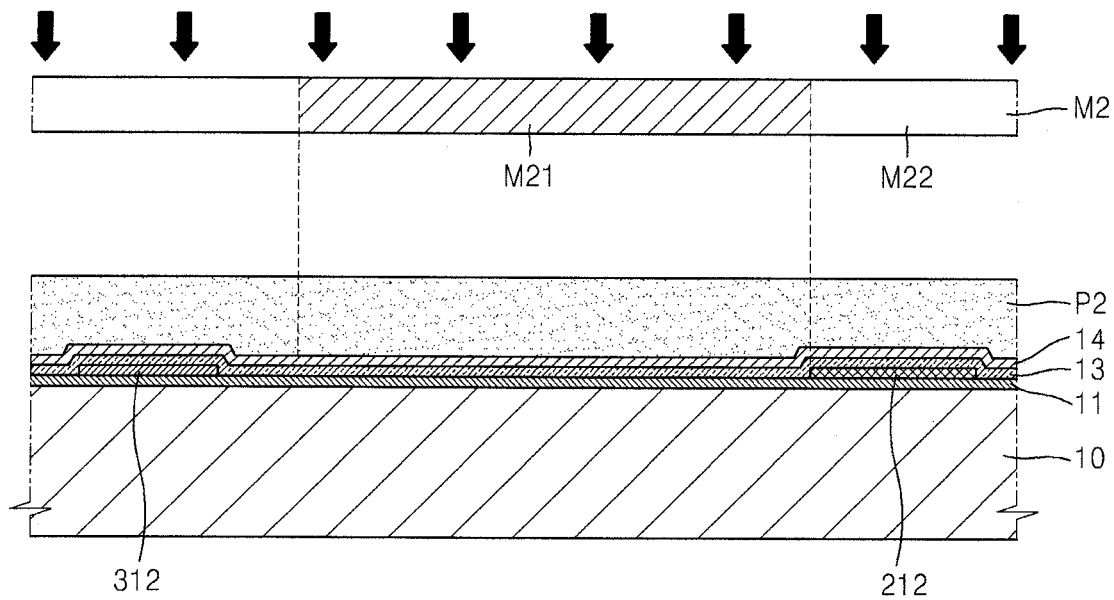

Referring to FIG. 13, a second photoresist P2 is coated on the transreflective metal layer 14, and a second mask process is performed by using a second photomask M2 including a light shield part M21 and a light transmitting part M22.

Figure 14:
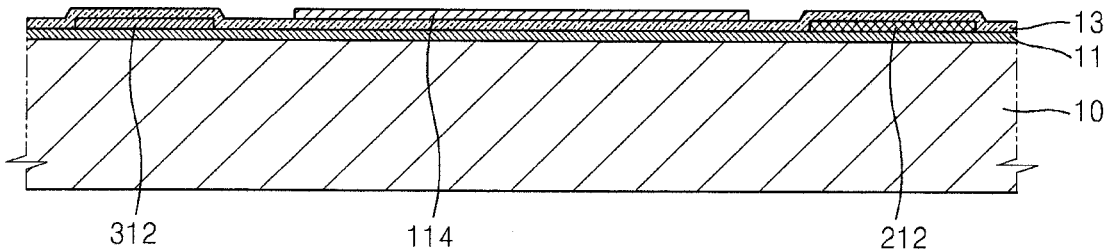

Referring to FIG. 14, as a result of the second photomask process, the transreflective metal layer 14 is patterned as a pixel electrode 114.

As described above, a transreflective mirror may be formed of an Ag alloy having a high transreflective characteristic to further improve the luminance efficiency of an organic light-emitting display apparatus having an optical resonance structure.

Figure 15:
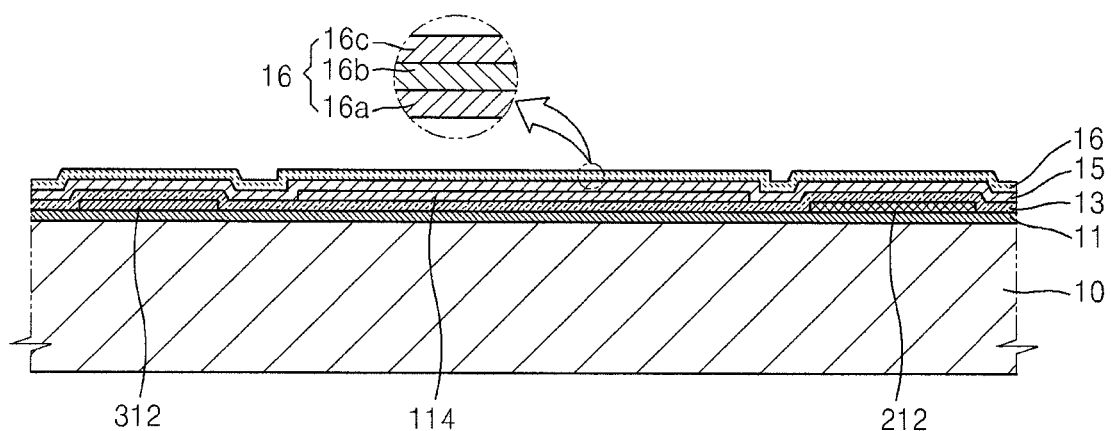

Referring to FIG. 15, a transparent conductive layer 15 and a first metal layer 16 are sequentially stacked on a structure shown in FIG. 14.

The transparent conductive layer 15 may include at least one selected from the group consisting of indium tin oxide (ITO), indium zinc oxide (IZO), zinc oxide (ZnO), indium oxide (In2O3), indium gallium oxide (IGO), and aluminum zinc oxide (AZO).

The first metal layer 16 may be formed of a metal having a different etch rate from the pixel electrode 114. For example, the first metal layer 16 may include one or more metals selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). In an embodiment, the first metal layer 16 includes Al.

The first metal layer 16 may include a plurality of metal layers 16a, 16b, and 16c. In an embodiment, the first metal layer 16 has three-layer structure (Mo/Al/Mo) in which molybdenum (Mo) layers 16a and 16c are formed on and underneath an Al layer 16b. However, the present invention is not limited thereto, and thus the first metal layer 16 may be formed of various suitable types of materials and as various suitable kinds and numbers of layers.

Figure 16:
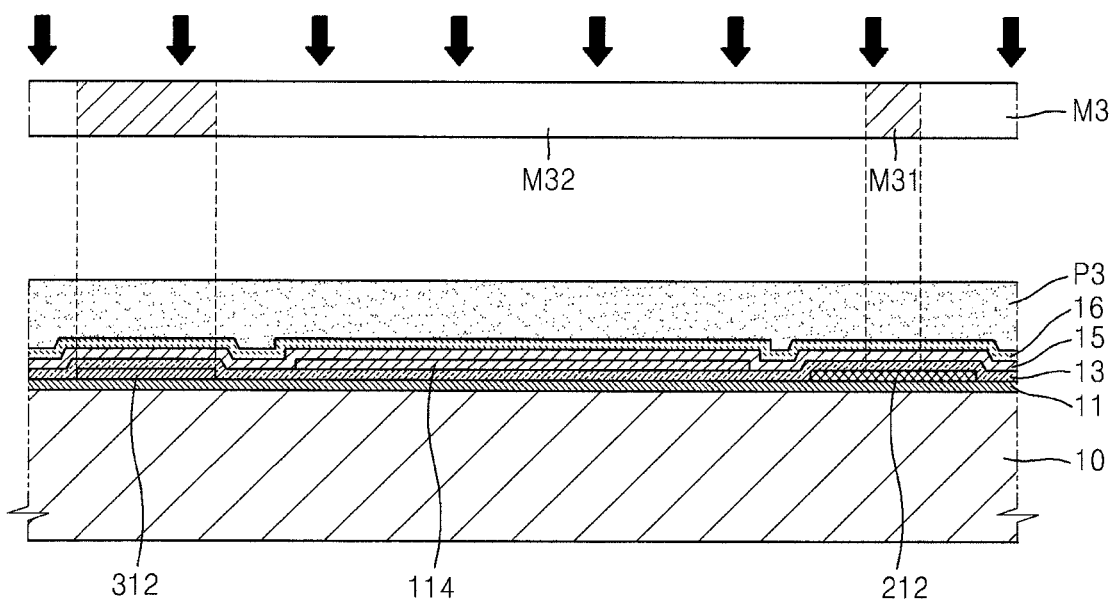

Referring to FIG. 16, a third photoresist P3 is coated on the first metal layer 16, and a third mask process is performed by using a third photomask M3 including a light-shield part M31 and a light-transmitting part M32.

Figure 17:
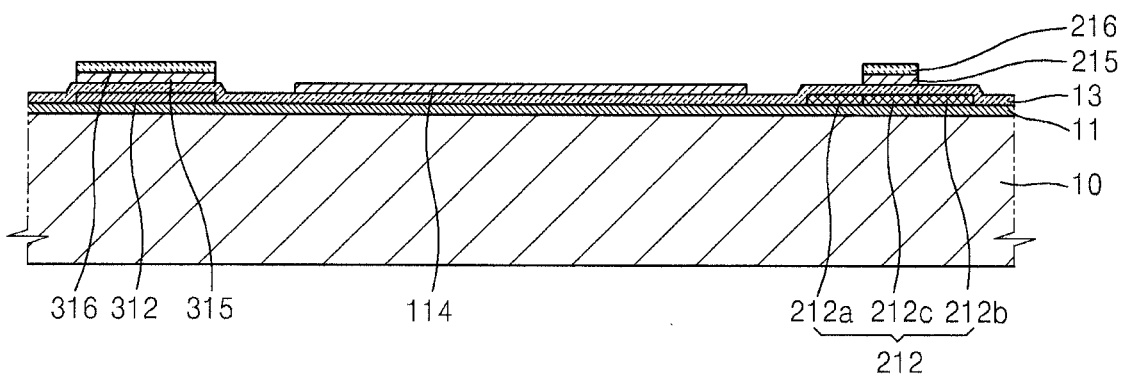

Referring to FIG. 17, as a result of the third photomask process, the transparent conductive layer 15 and the first metal layer 16 are patterned as first and second gate electrodes 215 and 216 of a TFT, and first and second upper electrodes 315 and 316 of a capacitor.

The first and second gate electrodes 215 and 216, and the first and second upper electrodes 315 and 316, are etched in the same mask process, and thus their external etched surfaces are identically formed.

Figure 18:
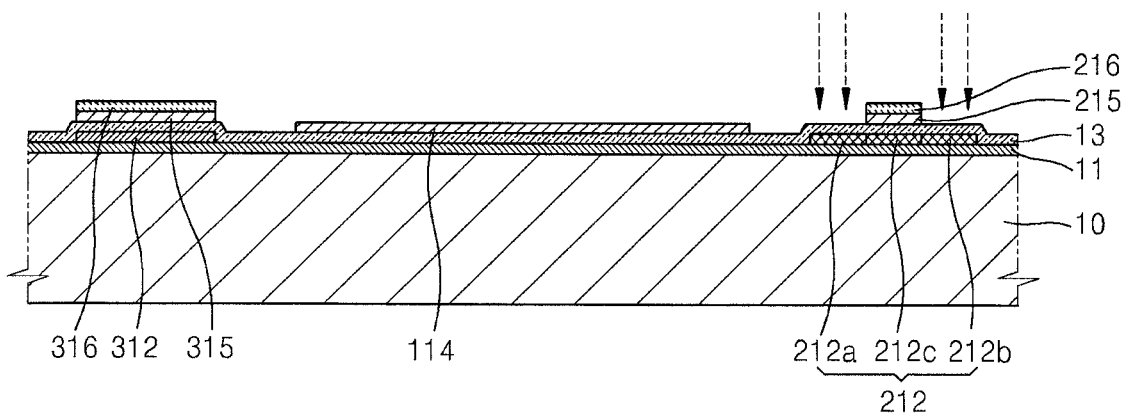
Figure 19:
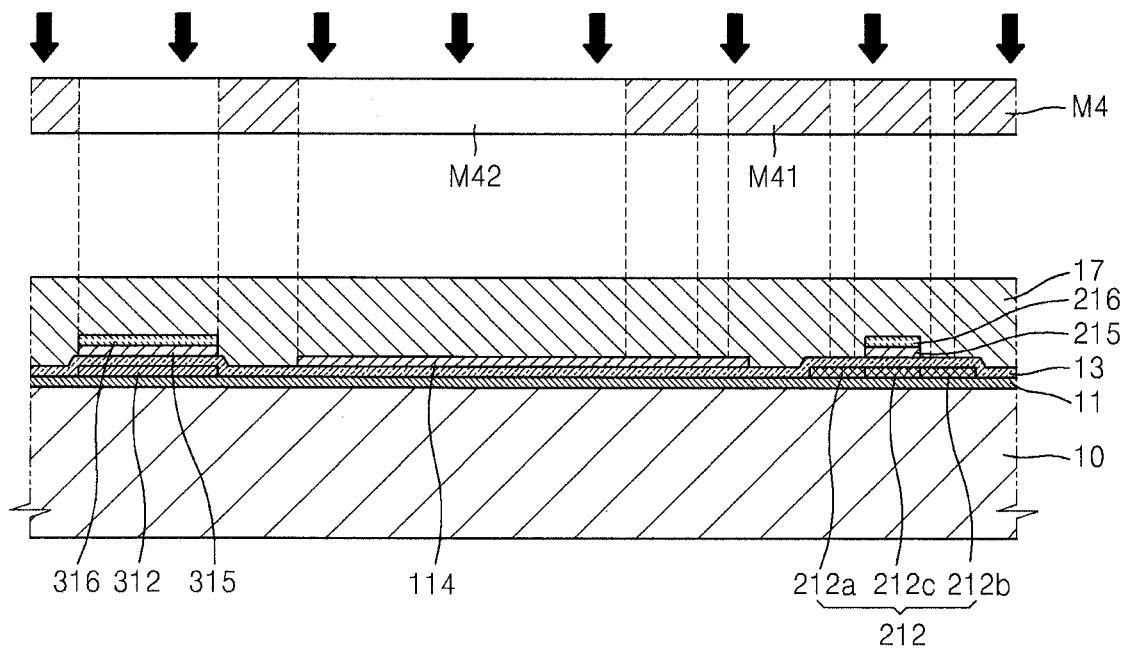

Referring to FIG. 18, the first and second gate electrodes 215 and 216 formed as a result of the third photomask process are used as self-align masks to dope the active layer 212 with a dopant. As a result, the active layer 212 includes source and drain areas 212a and 212b doped with an ion dopant and a channel area 212c formed of the source and drain areas 212a and 212b. In other words, the first and second gate electrodes 215 and 216 are used as the self-align masks to form the source and drain areas 212a and 212b without any additional photomask process.

As described above, according to embodiments of the present invention, the pixel electrode 114 may be used as the transreflective metal layer 14, which is directly a transreflective layer, thereby simplifying a structure of the pixel electrode 114. Also, in embodiments where the pixel electrode 14 is formed of an Ag alloy, light efficiency may be improved.

In embodiments where the pixel electrode 114 is etched in a mask process separate from the first metal layer 16 forming the second gate electrode 216 having a different etch rate, damage to the pixel electrode 114 may be prevented or reduced due to etching of the second gate electrode 216.

Referring to FIG. 19, a second insulating layer 17 and a fourth photoresist P4 are coated on a resultant structure of the third photomask process. A fourth mask process is performed by using a fourth photomask M4 including a light-shield part M41 and a light-transmitting part M42.

Figure 20:
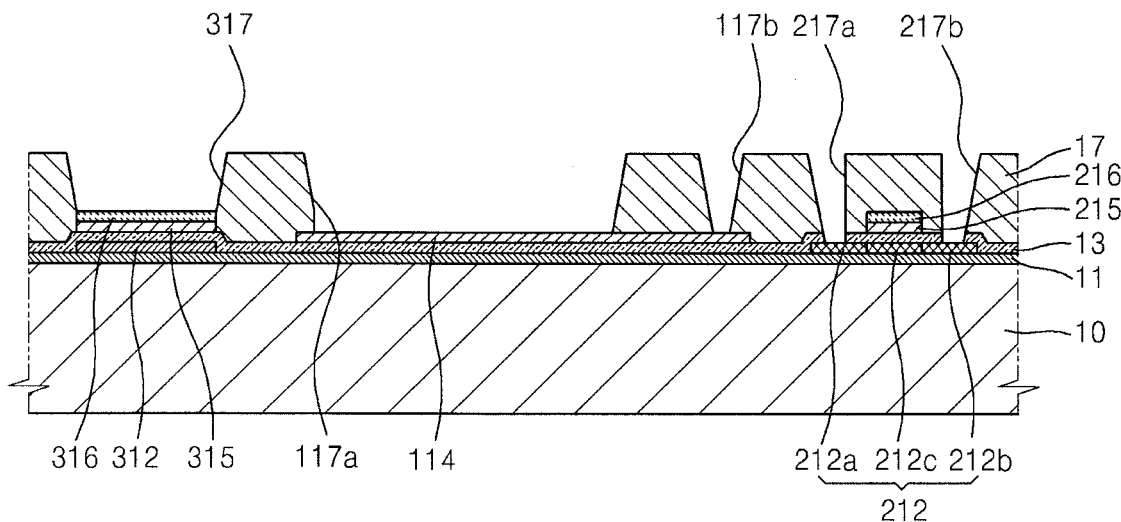

Referring to FIG. 20, first and second openings 117a and 117b exposing the pixel electrode 114, contact holes 217a and 217b exposing the source and drain areas 212a and 212b of the TFT, and a third opening 317 exposing the second upper electrode 316 of the capacitor are formed on the second insulating layer 17 as a result of the fourth mask process.

Figure 21:
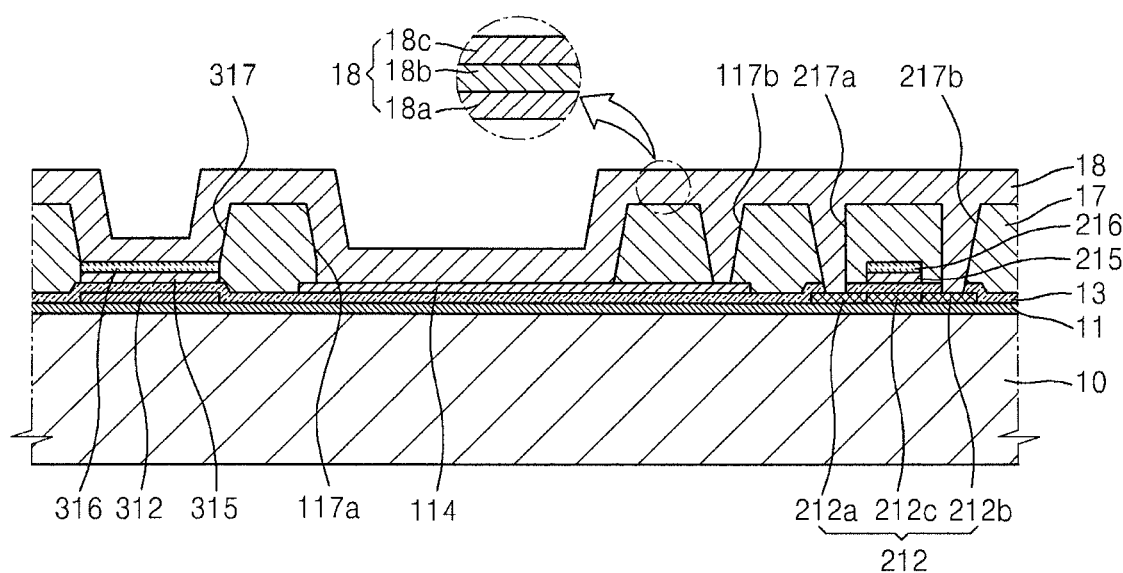

Referring to FIG. 21, a second metal layer 18 is formed on a structure resulting from the forming of the openings and contact holes in FIG. 20.

The second metal layer 18 may include one or more metals selected from Al, Pt, Pd, Ag, Mg, Au, Ni, Nd, Ir, Cr, Li, Ca, Mo, Ti, W, and Cu. In an embodiment, the third metal layer 18 includes Al.

The second metal layer 19 may also include a plurality of metal layers 18a, 18b, and 18c. In an embodiment, like the first metal layer 16, the second metal layer 18 has a three-layer structure in which Mo layers 18a and 18c are formed on and underneath an Al layer 18b. However, the present invention is not limited thereto, and thus the third metal layer 18 may be formed of various suitable materials and such as various suitable kinds and numbers of layers.

Figure 22:
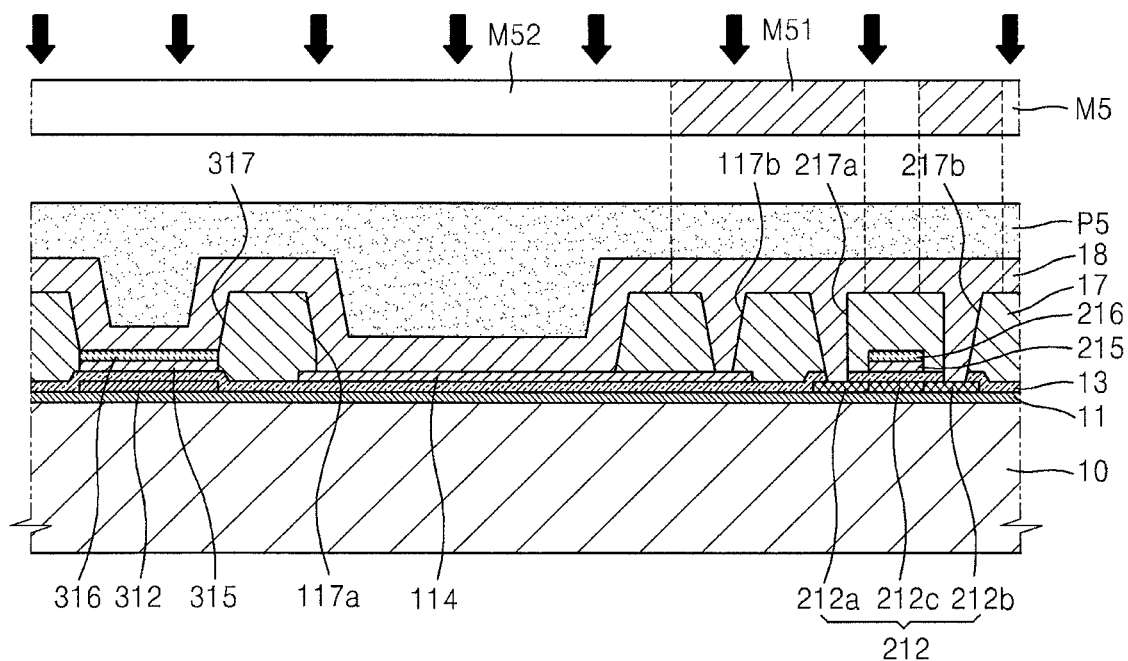

Referring to FIG. 22, a fifth photoresist P5 is coated on the second metal layer 18, and a fifth mask process is performed by using a fifth photomask M5 including a light-shielding part M51 and a light-transmitting part M52.

Figure 23:
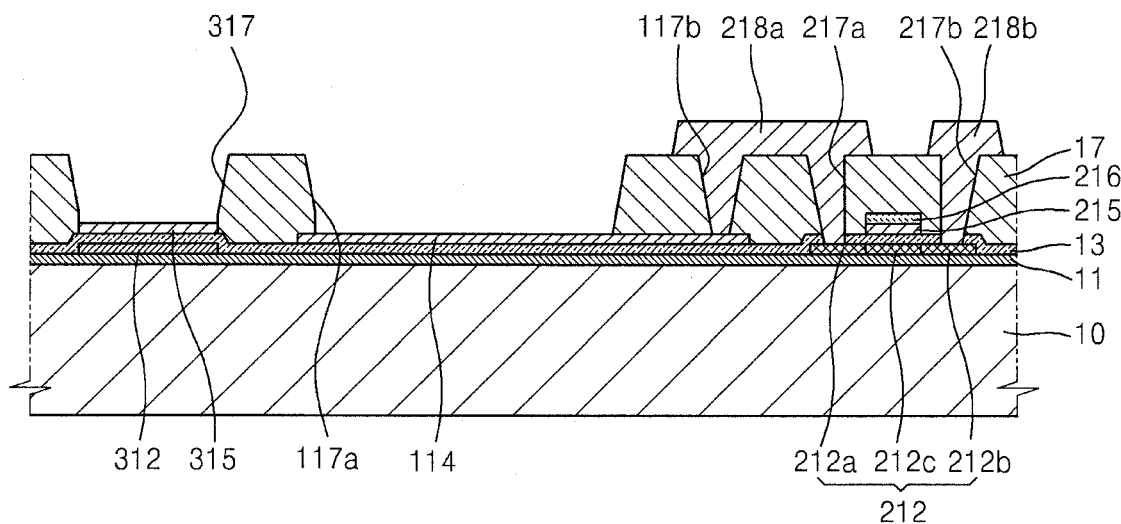

Referring to FIG. 23, the second metal layer 18 is patterned to form source and drain electrodes 218a and 218b contacting the source and drain areas 212a and 212b of the active layer 212. When the second metal layer 18 is etched, the second upper electrode 316 of the capacitor including the first metal layer 16 may be removed together with the second metal layer 18.

The second metal layer 18 may be formed of the same material as that of the metal layer 18. In this case, the first and second metal layers 16 and 18 may be simultaneously or concurrently etched through one-time etching by using the same etchant.

Figure 24:
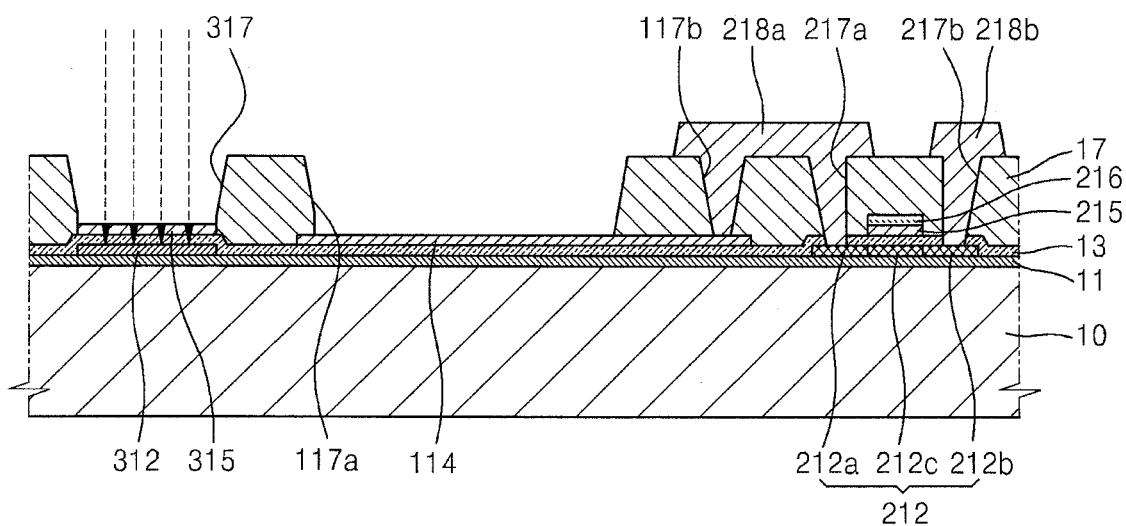

Referring to FIG. 24, an ion dopant, such as B or P dopant, is doped on a resultant structure of the fifth mask process. A dopant may be doped at a density of $1 \times 10^{15}$ atoms/cm$^2$ or more by targeting the lower electrode 312 of the capacitor formed as the partially crystallized Si layer 12'. Therefore, a conductivity of the lower electrode 312 of the capacitor increases to form a metal-insulator-metal (MIM) capacitor along with the first upper electrode 315, thereby increasing a capacitance of the capacitor.

Figure 25:
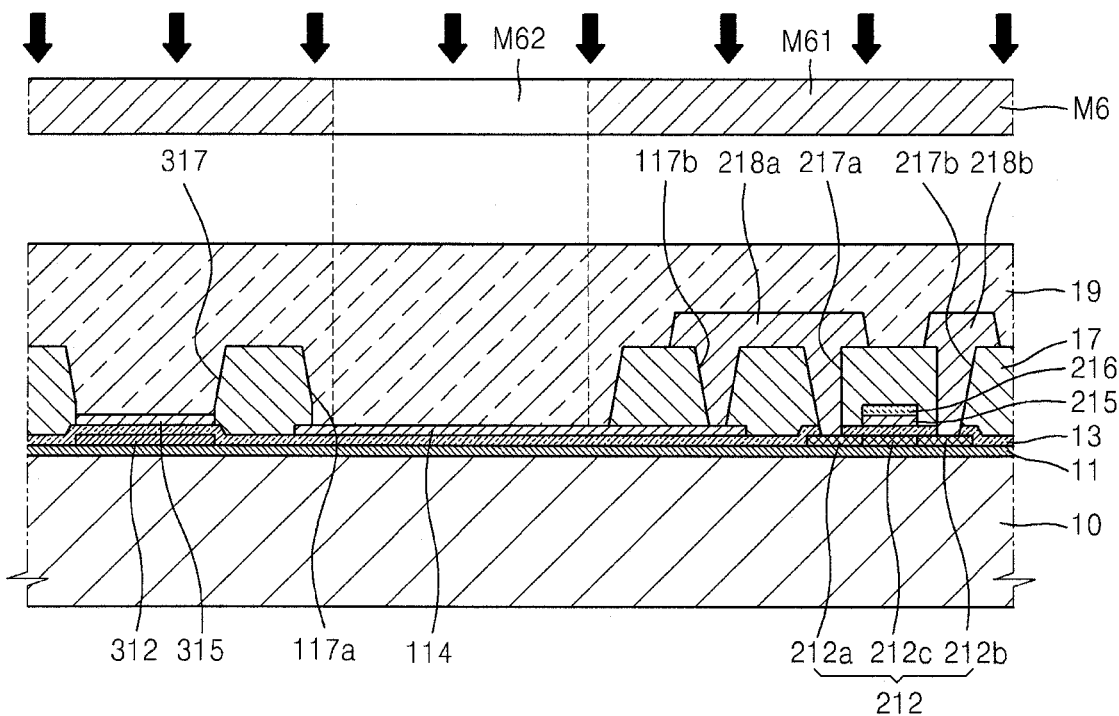

Referring to FIG. 25, a third insulating layer 19 is formed on a resultant structure of FIG. 24, and a sixth mask process is performed by using a sixth photomask M6 including a light-shielding part M61 and light-transmitting part M62. Here, the third insulating layer 19 may be formed of photoresist including a photosensitive material.

Figure 26:
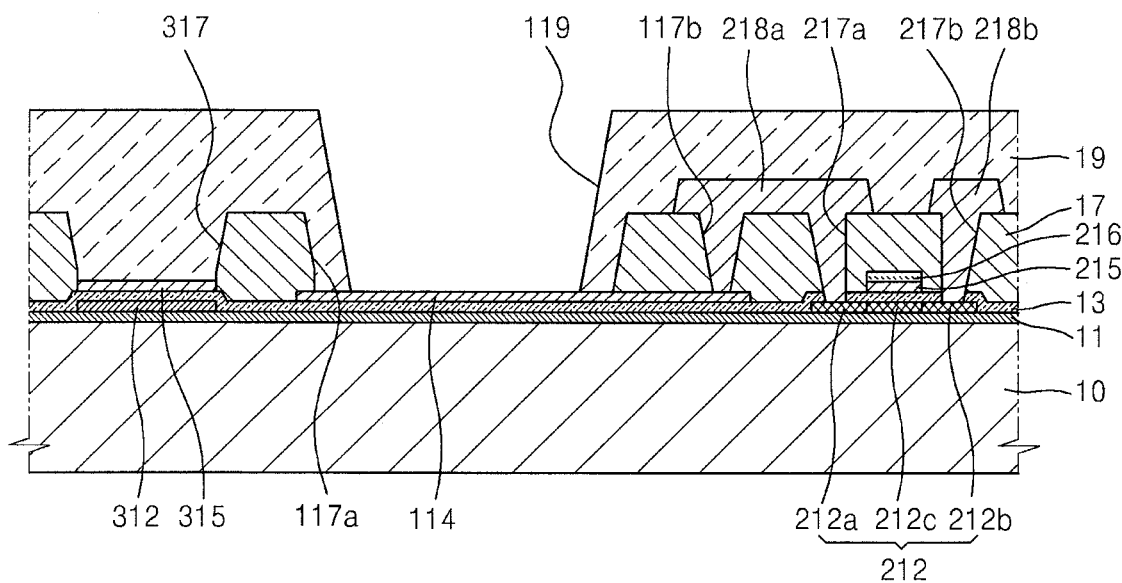

Referring to FIG. 26, the third insulating layer 19 is patterned to form an opening 119 exposing the pixel electrode 114.

Figure 27:
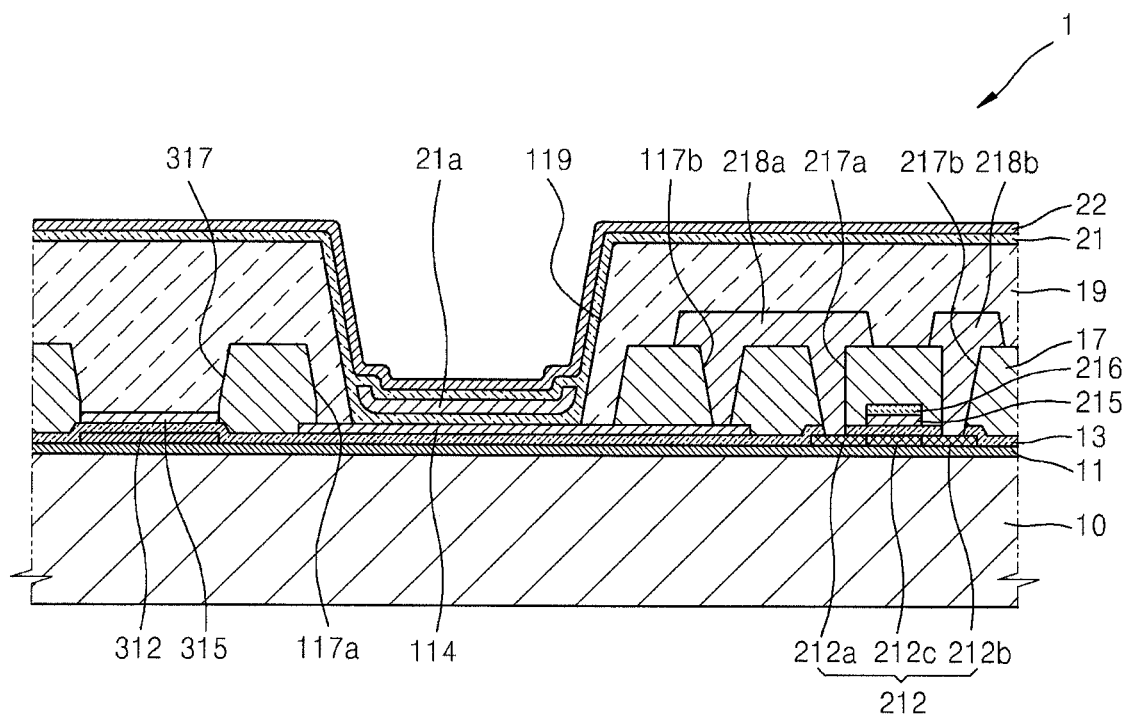

Referring to FIG. 27, an intermediate layer 21 including an organic emission layer 21a and a counter electrode 22 are formed on the pixel electrode 114.

The organic emission layer 21a may be formed of a low or high molecular material.

The intermediate layer 21 may include, for example, a hole transport layer (HTL), a hole injection layer (HIL), an electron transport layer (ETL), and/or an electron injection layer (EIL), which are stacked on the organic emission layer 21a. Various other suitable layers may also be stacked.

As described above, the intermediate layer 21 including the emission layer 21a may be formed so that a thickness of the organic emission layer 21a or thicknesses of other layers of the intermediate layer 21 other than the organic emission layer 21a are different in each pixel, thereby providing an optical resonance structure.

The counter electrode 22 is deposited as a common electrode on the intermediate layer 21. In the organic light-emitting display apparatus according to an embodiment, the pixel electrode 114 is used as an anode electrode, and the counter electrode 22 is used as a cathode electrode. Polarities of electrodes may be oppositely applied.

Also, the counter electrode 22 may be formed as a reflective electrode including a reflective material to realize the optical resonances structure. Here, the counter electrode 22 may be formed of Al, Ag, Li, Ca, LiF/Ca, or LiF/Al.

Although not explicitly shown in the drawings, a sealing member and a moisture absorbent may be further included on the counter electrode 22 to protect the organic emission layer 21a from external moisture or oxygen.

According to an embodiment of the present invention, a distance between the counter electrode 22 and the pixel electrode 114 may be a resonance thickness to further improve the light efficiency by using an optical resonance even in a back surface emission structure in which an image is provided in a direction of the substrate 10.

Also, a poly-Si layer doped with N+ or P+ may be used as the low electrode 312 of the capacitor, and the first upper electrode 315 may be formed of a metal oxide which is a transparent conductive material, thereby forming a capacitor having an MIM structure. If the capacitor has a metal oxide semiconductor (MOS) structure, and a high voltage is to be applied to a particular line of a panel, a possibility that an electric short may occur is increased. However, according to embodiments the present invention, as described above, an MIM capacitor may be used to prevent or reduce the above problem. Therefore, a design degree of freedom is improved. As described above, according to embodiments of the present invention, crystallization productivity may be improved, and a characteristic of a capacitor may be improved.

While the present invention has been particularly shown and described with reference to embodiments thereof, that the invention is not limited to the disclosed embodiments, but, on the contrary, is intended to cover various modifications and equivalent arrangements included within the spirit and scope of the appended claims, and equivalents thereof. It will be understood by those of ordinary skill in the art that various changes in form and details may be made to embodiments described herein without departing from the spirit and scope of the present invention.

What is claimed is:

1. A method of manufacturing an organic light-emitting display apparatus, the method comprising:
    a first mask process comprising forming an amorphous silicon (a-Si) layer on a substrate having a first area and a second area, partially crystallizing the a-Si layer to convert the a-Si layer into a partially crystallized Si layer, re-crystallizing the partially crystallized Si layer on the first area to form a poly-Si layer, patterning the poly-Si layer on the first area to form active layers of TFTs, and patterning the partially crystallized Si layer on the second area to form lower electrodes of capacitors;
    a second mask process comprising forming a first insulating layer and a transreflective metal on the substrate to cover the active layers and the lower electrodes of the capacitors and patterning the transreflective metal to form pixel electrodes;
    a third mask process comprising sequentially forming a transparent conductive layer and a first metal layer on the substrate to cover the pixel electrodes and patterning the transparent conductive layer and the first metal layer to form first and second gate electrodes of the TFTs and first and second upper electrodes of the capacitors;
    a fourth mask process comprising forming a second insulating layer to cover the pixel electrodes, the first and second gate electrodes, and the first and second upper electrodes and patterning the second insulating layer to form openings exposing the pixel electrodes, source and drain areas of the active layers, and the second upper electrodes;
    a fifth mask process comprising forming a second metal layer to cover the pixel electrodes and the openings and patterning the second metal layer to form source and drain electrodes; and
    a sixth mask process comprising forming a third insulating layer to cover the source and drain electrodes and patterning the third insulating layer to expose the pixel electrodes.

2. The method of claim 1, wherein the first mask process further comprises forming a buffer layer on the substrate before the forming of the a-Si layer.

3. The method of claim 1, wherein the substrate has a plurality of the first areas comprising the first area, and a plurality of the second areas comprising the second area, and the plurality of the first areas and the plurality of the second areas alternate with each other and are spaced apart.

4. The method of claim 1, wherein the partially crystallized Si layer has a crystallinity of between about 65% and about 80%.

5. The method of claim 1, wherein the partially crystallizing the a-Si layer in the first mask process comprises:
    thermally treating the a-Si layer formed on the substrate at a temperature between 650° C. and 780° C.;
    partially crystallizing the a-Si layer into the partially crystallized Si layer; and
    forming a thermal oxide layer on the partially crystallized Si layer.

6. The method of claim 5, wherein the re-crystallizing the partially crystallized Si layer on the first area in the first mask process comprises:
    selectively irradiating the partially crystallized Si layer on the first area with laser beams; and
    re-crystallizing the partially crystallized Si layer into a poly-Si layer.

7. The method of claim 6, wherein the poly-Si layer has a higher crystallinity than the partially crystallized Si layer.

8. The method of claim 5, further comprising removing the thermal oxide layer by using a buffered oxide etchant (BOE) or HF.

9. The method of claim 6, wherein the laser beams are excimer laser beams.

10. The method of claim 1, further comprising using the second gate electrodes as masks to dope the source and drain areas of the active layers with an ion dopant after the third mask process.

11. The method of claim 1, further comprising exposing the first upper electrodes, and doping the lower electrodes with an ion dopant through the exposed first upper electrodes.

12. The method of claim 1, wherein the transreflective metal comprises a silver (Ag) alloy.

13. The method of claim 12, wherein the silver (Ag) alloy comprises palladium (Pd) or copper (Cu).

14. The method of claim 12, wherein the transreflective metal has a thickness of between 80 Å and 200 Å.

15. The method of claim 1, wherein in the third mask process, the sequentially forming of the transparent conductive layer and the first metal layer on the substrate to cover the pixel electrodes, comprises patterning the transparent conductive layer and the first metal layer to sequentially cover the pixel electrodes.

16. The method of claim 15, wherein the fourth mask process further comprises patterning the second insulating layer to form an opening exposing the first metal layer covering the pixel electrodes.

17. The method of claim 16, wherein the fifth mask process further comprises removing the first metal layer and the second metal layer covering the pixel electrodes.

18. The method of claim 16, wherein the first and second metal layers are a same kind of material.

* * * * *